United States Patent
Toujo

(10) Patent No.: US 12,355,416 B2
(45) Date of Patent: Jul. 8, 2025

(54) COIL COMPONENT, FILTER CIRCUIT INCLUDING THE COIL COMPONENT, AND ELECTRONIC DEVICE

(71) Applicant: Murata Manufacturing Co., Ltd., Nagaokakyo (JP)

(72) Inventor: Atsushi Toujo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 287 days.

(21) Appl. No.: 18/109,896

(22) Filed: Feb. 15, 2023

(65) Prior Publication Data

US 2023/0198490 A1 Jun. 22, 2023

Related U.S. Application Data

(63) Continuation of application No. PCT/JP2021/033751, filed on Sep. 14, 2021.

(30) Foreign Application Priority Data

Oct. 1, 2020 (JP) ................. 2020-167205

(51) Int. Cl.
*H03H 7/01* (2006.01)
*H03H 1/00* (2006.01)
*H03H 1/02* (2006.01)

(52) U.S. Cl.
CPC ............ *H03H 7/0115* (2013.01); *H03H 1/02* (2013.01); *H03H 7/1791* (2013.01); *H03H 2001/0085* (2013.01)

(58) Field of Classification Search
CPC ................... H03H 2001/0085; H03H 7/0115
(Continued)

(56) References Cited

U.S. PATENT DOCUMENTS 6,476,689 B1 11/2002 Uchida et al.
2009/0160582 A1 6/2009 Fukamachi et al.
(Continued)

FOREIGN PATENT DOCUMENTS

JP 2001160728 A 6/2001
JP 2006270532 A 10/2006
(Continued)

OTHER PUBLICATIONS

Office Action in JP2022-106934, mailed Sep. 12, 2023, 6 pages.
(Continued)

*Primary Examiner* — Rakesh B Patel
(74) *Attorney, Agent, or Firm* — Keating & Bennett, LLP

(57) ABSTRACT

An electronic device includes an IC mounted on a substrate and a filter circuit connected to the IC. The filter circuit includes a coil component and a capacitor. The coil component includes a multilayer body, a first coil including a portion of multiple wiring patterns laminated in the multilayer body, a second coil provided on layers different from those of the first coil and including a portion of the multiple wiring patterns, and first, second and third electrodes provided on side surfaces. An opening of the first coil is at least partially overlapped with an opening of the second coil when viewed from a main surface direction. The third electrode is grounded via the capacitor. The first coil has an inductance lower than that of the second coil.

20 Claims, 8 Drawing Sheets

(58) Field of Classification Search
USPC .................................................. 333/175, 185
See application file for complete search history.

(56) References Cited

U.S. PATENT DOCUMENTS

| | | |
|---|---|---|
| 2018/0054177 A1* | 2/2018 | Mudakatte ............... H10D 1/68 |
| 2018/0212583 A1 | 7/2018 | Toujo |
| 2020/0082982 A1 | 3/2020 | Yazaki |
| 2020/0252041 A1 | 8/2020 | Ishizuka |

FOREIGN PATENT DOCUMENTS

| | | |
|---|---|---|
| JP | 2009153106 A | 7/2009 |
| JP | 2018050022 A | 3/2018 |
| WO | 2016170708 A1 | 10/2016 |
| WO | 2017110179 A1 | 6/2017 |
| WO | 2017199749 A1 | 11/2017 |
| WO | 2018235527 A1 | 12/2018 |
| WO | 2019107081 A1 | 6/2019 |
| WO | 2020121592 A1 | 6/2020 |

OTHER PUBLICATIONS

International Search Report in PCT/JP2021/033751, mailed Nov. 22, 2021, 3 pages.
Written Opinion in PCT/JP2021/033751, mailed Nov. 22, 2021, 4 pages.

* cited by examiner

COIL COMPONENT, FILTER CIRCUIT INCLUDING THE COIL COMPONENT, AND ELECTRONIC DEVICE

CROSS REFERENCE TO RELATED APPLICATIONS

This application claims the benefit of priority to Japanese Patent Application No. 2020-167205 filed on Oct. 1, 2020 and is a Continuation Application of PCT Application No. PCT/JP2021/033751 filed on Sep. 14, 2021. The entire contents of each application are hereby incorporated herein by reference.

BACKGROUND OF THE INVENTION

1. Field of the Invention

The disclosure relates to a coil component, a filter circuit including the coil component, and an electronic device.

2. Description of the Related Art

Measures against noise using filter circuits are frequently adopted in electronic devices. The filter circuits used for the measures against noise include, for example, an electromagnetic interference (EMI) filter. The filter circuit passes necessary components in current flowing through a conductor and eliminates unnecessary components therein. In addition, since the filter circuit uses a capacitor, which is a capacitance element, a noise reduction effect is known to be reduced due to equivalent series inductance (ESL), which is parasitic inductance of the capacitor.

Techniques are known to cancel the equivalent series inductance ESL of the capacitor with negative inductance, which is caused by magnetic coupling between two coils, to widen the frequency band in which the noise reduction effect of the filter circuit is achieved (for example, Japanese Unexamined Patent Application Publication No. 2001-160728). In addition, filter circuits are known which include a capacitor that is capable of supplying electric charge to a circuit component not through coils in order to keep electric charge supply performance to the circuit component (see, for example, International Publication No. 2017/110179).

Although the filter circuit is capable of cancelling the equivalent series inductance ESL of the capacitor using mutual inductance M caused by the magnetic coupling between two coils, it is necessary to include the coils in a line used for supplying power from a power supply in order to generate the mutual inductance M. The inclusion of the coils in the line is effective in the filter circuit for the noise reduction and does not present a problem.

However, when the power is supplied from the power supply to an electronic device including a circuit component, such as an integrated circuit (IC), the capacitor connected to the coils is not only used for the noise reduction but also has a role to supply the electric charge to the circuit component when power consumption is temporarily increased. Accordingly, the inclusion of the coils in the line used for supplying the electric charge from the capacitor may delay rising of the electric charge to be supplied from the capacitor to the circuit component. Consequently, there are cases in which the filter circuit using the mutual inductance M is not applicable to a power line connected to the circuit component. In addition, since the capacitor is additionally required in International Publication No. 2017/110179, the number of the components is increased to cause problems of the manufacturing cost and the product size.

SUMMARY OF THE INVENTION

Preferred embodiments of the present invention provide coil components usable in a filter circuit to be applied to a power line connected to a circuit component, filter circuits including the coil components, and electronic devices.

An electronic device according to a preferred embodiment of the present disclosure includes an IC mounted on a substrate and a filter circuit connected to the IC. The filter circuit includes a coil component and a capacitor. The coil component includes a pair of main surfaces that are opposed to each other, and four side surfaces with which the main surfaces are connected to each other, a first coil including a portion of multiple wiring patterns in the body, a second coil including another portion of the multiple wiring patterns, a first electrode on a first side surface and electrically connected to one end of the first coil, a second electrode on a second side surface opposed to the first side surface and electrically connected to one end of the second coil, and a third electrode on a third side surface not opposed to the first side surface and electrically connected to the other end of the first coil and the other end of the second coil. An opening of the first coil is at least partially overlapped with an opening of the second coil when viewed from a main surface direction. The first electrode is connected to the IC. The third electrode is grounded via the capacitor. The first coil has an inductance lower than that of the second coil.

A coil component according to a preferred embodiment of the present disclosure includes a body including a pair of main surfaces that are opposed to each other, and four side surfaces with which the main surfaces are connected to each other, a first coil including a portion of multiple wiring patterns in the body, a second coil including another portion of the multiple wiring patterns, a first electrode on a first side surface and electrically connected to one end of the first coil, a second electrode on a second side surface opposed to the first side surface and electrically connected to one end of the second coil, and a third electrode on a third side surface not opposed to the first side surface and electrically connected to the other end of the first coil and the other end of the second coil. An opening of the first coil is at least partially overlapped with an opening of the second coil when viewed from a main surface direction. The third electrode is grounded via the capacitor. The first coil has an inductance lower than that of the second coil.

A filter circuit according to a preferred embodiment of the present disclosure includes the coil component and a capacitor that is connected to the third electrode between the first coil and the second coil in the coil component.

According to preferred embodiments of the present disclosure, since the first coil has an inductance lower than that of the second coil, it is possible to improve rising of electric charge supplied from the capacitor connected to the third electrode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Coil components, filter circuits including the coil components, and electronic devices according to preferred embodiments will be described below.

First Preferred Embodiment

Figure 1:
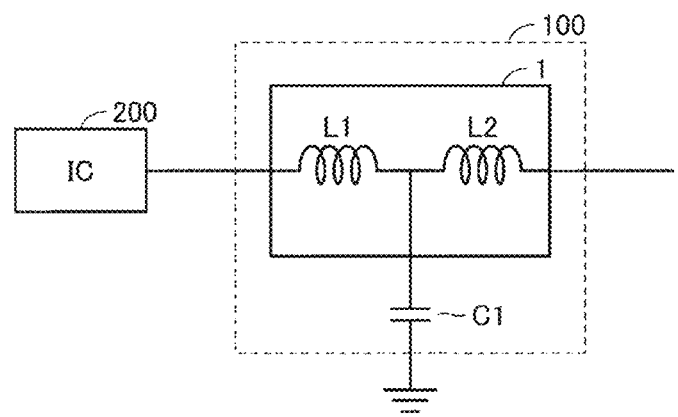
FIG. 1 is a diagram schematically illustrating the configuration of an electronic device according to a first preferred embodiment of the present invention.

An electronic device according to a first preferred embodiment will first be described with reference to the drawings. FIG. 1 is a diagram schematically illustrating the configuration of the electronic device according to the first preferred embodiment. The electronic device includes a circuit component 200 mounted on a substrate (not illustrated) and a filter circuit 100 connected to the circuit component 200 with its one end.

The circuit component 200 is, for example, an integrated circuit (IC) and uses electric charge accumulated in a capacitor included in the filter circuit 100 when power consumption is temporarily increased.

The filter circuit 100 is, for example, an EMI filter and is a third-order T-shaped LC filter circuit. One end of the filter circuit 100 is connected to the circuit component 200 and the other end thereof is connected to a power supply (not illustrated). The filter circuit 100 passes necessary components in current flowing from the power supply to the circuit component 200 and eliminates unnecessary components therein. Since a capacitor C1, which is a capacitance element, is used in the filter circuit 100, negative inductance caused by magnetic coupling between two coils is used to cancel equivalent series inductance ESL of the capacitor.

Figure 2:
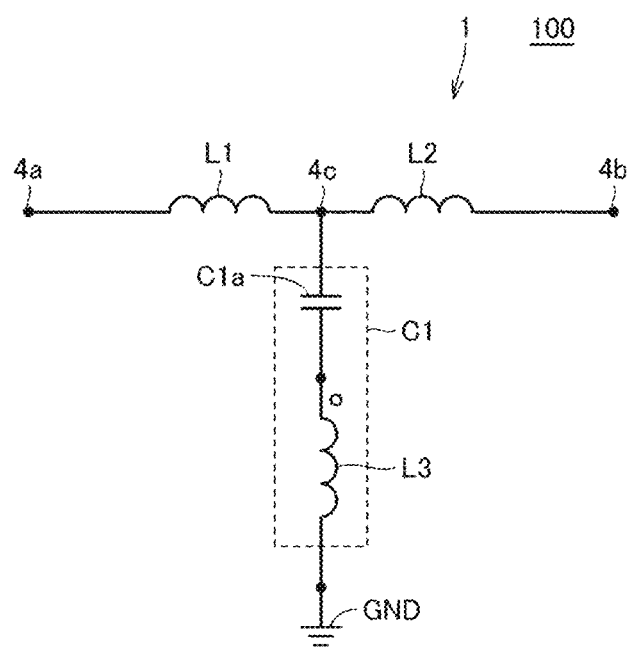
FIG. 2 is a circuit diagram of a filter circuit including a coil component according to the first preferred embodiment of the present invention.

Although the configuration of the filter circuit 100 is described using the third-order T-shaped LC filter circuit in the following preferred embodiments, a coil component having the same configuration is applicable to a fifth-order T-shaped LC filter circuit and a higher-order T-shaped LC filter circuit. FIG. 2 is a circuit diagram of the filter circuit 100 including a coil component according to the first preferred embodiment. The filter circuit 100 includes the capacitor C1, electrodes 4a, 4b, and 4c, a coil L1 (first coil), and a coil L2 (second coil), as illustrated in FIG. 2.

One end portion of the capacitor C1 is connected to the electrode 4c and the other end portion thereof is connected to a GND line, as illustrated in FIG. 2. The capacitor C1 is not limited to a multilayer ceramic capacitor containing $BaTiO_3$ (barium titanate) as a principal component and may be a multilayer ceramic capacitor containing another material as the principal component or a capacitor of another kind, such as an aluminum electrolytic capacitor, which is not the multilayer ceramic capacitor. The capacitor C1 includes an inductor L3 as parasitic inductance (the equivalent series inductance ESL) and is equivalent to a circuit configuration in which the inductor L3 is connected in series to a capacitor C1a. The capacitor C1 may be equivalent to a circuit configuration in which parasitic resistance (equivalent series resistance ESR) is further connected in series to the inductor L3 and the capacitor C1a.

In addition to the capacitor C1, the coil L1 and the coil L2 are connected to the electrode 4c. The coil L1 is magnetically coupled to the coil L2 to cause a negative inductance component. The parasitic inductance (the inductor L3) of the capacitor C1 is capable of being cancelled using the negative inductance component to apparently decrease the inductance component of the capacitor C1. Specifically, the filter circuit 100 composed of the capacitor C1, the coil L1, and the coil L2 cancels the parasitic inductance of the capacitor C1 with the negative inductance component caused by mutual inductance of the coil L1 and the coil L2 to improve a noise reduction effect in a high frequency band.

However, since the filter circuit 100 has the circuit configuration in which the coil L1 is magnetically coupled to the coil L2, the coil L1 exists between the circuit component 200 and the capacitor C1. When the circuit component 200 uses the electric charge accumulated in the capacitor C1 in the filter circuit 100 in the case where the power consumption is temporarily increased, the rising of the electric charge to be supplied from the capacitor C1 to the circuit component 200 may delay due to the inductance of the coil L1.

In order to resolve this problem, a coil component 1 according to the first preferred embodiment is configured so that the inductance of the coil L1 is made lower than that of the coil L2 while the parasitic inductance of the capacitor C1 is cancelled with the negative inductance component caused by the mutual inductance of the coil L1 and the coil L2. With this configuration, in the coil component 1, it is possible to reduce the delay of the rising of the electric charge to be supplied from the capacitor C1 to the circuit component 200.

Figure 3:
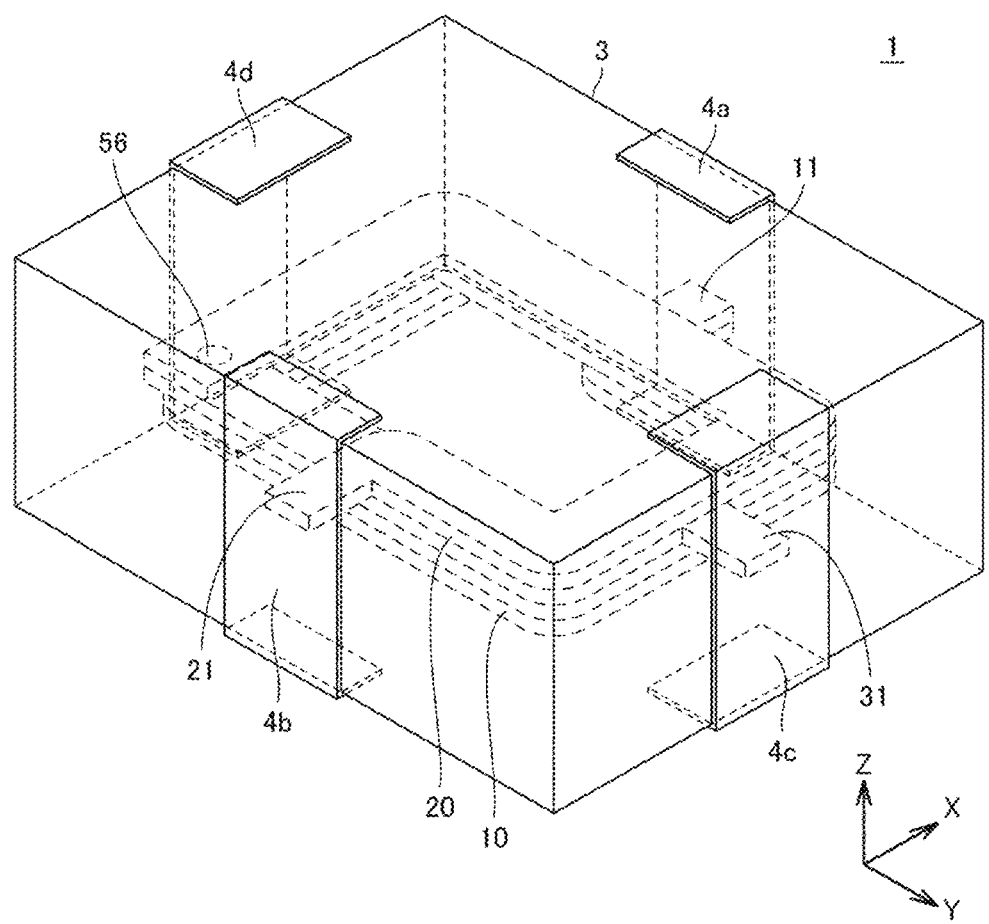
FIG. 3 is a perspective view of the coil component according to the first preferred embodiment of the present invention.
Figure 4A:
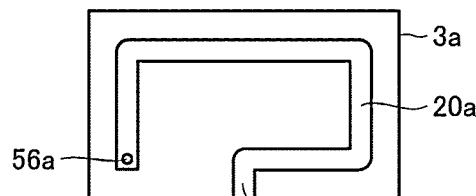
FIGS. 4A to 4D are exploded plan views illustrating the configuration of the coil component according to the first preferred embodiment of the present invention.
Figure 4B:
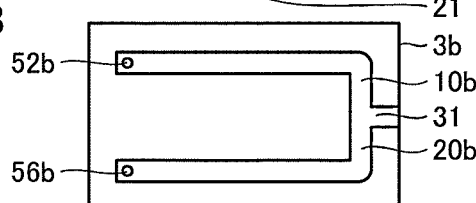
Figure 4C:
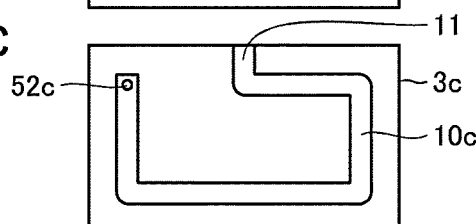
Figure 4D:
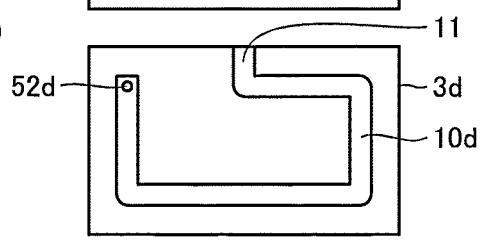
Figure 5:
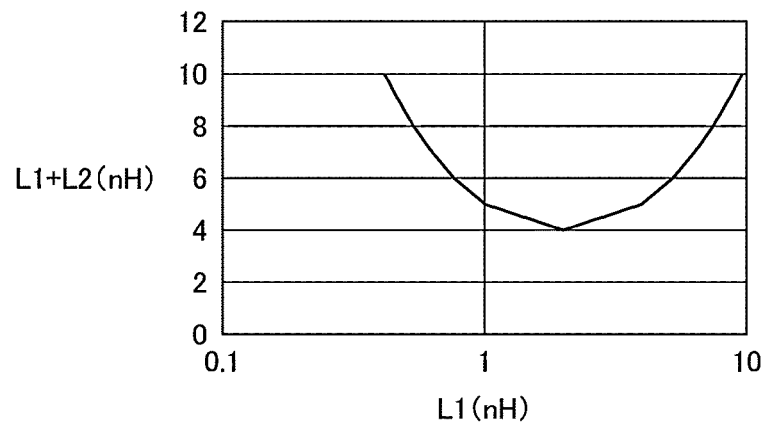
FIG. 5 is a graph for describing a combination of the inductance of a coil L1 and the inductance of a coil L2.
Figure 6:
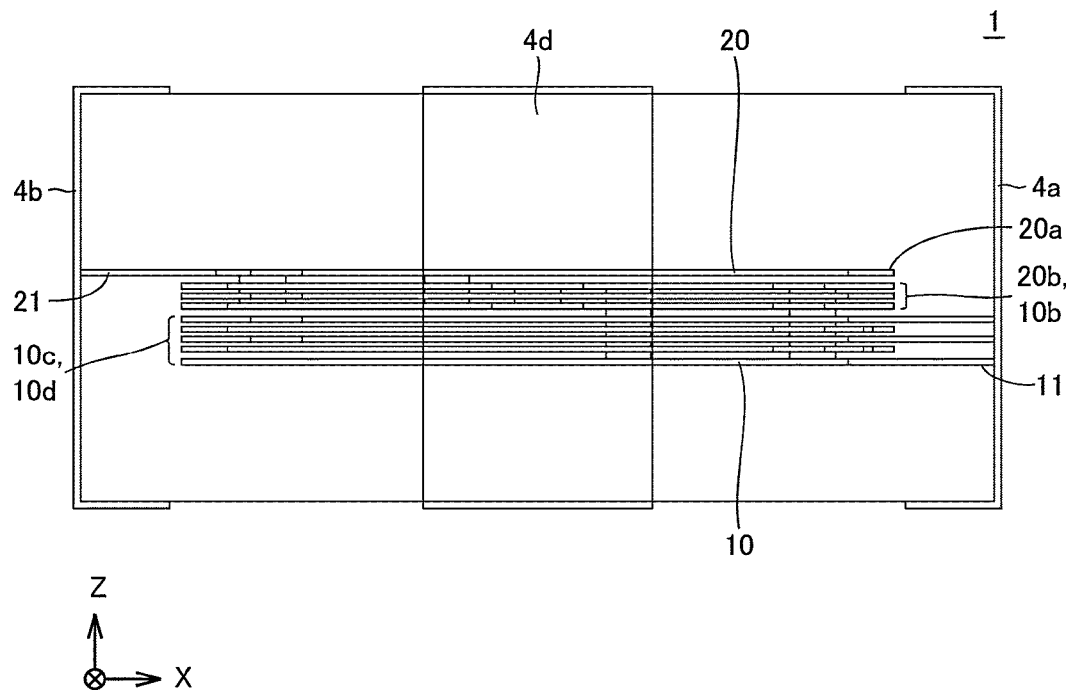
FIG. 6 is a cross-sectional view of the coil component according to the first preferred embodiment of the present invention.

The coil component 1 according to the first preferred embodiment will now be described in detail with reference to the drawings. FIG. 3 is a perspective view of the coil component 1 according to the first preferred embodiment. FIGS. 4A to 4D are exploded plan views illustrating the configuration of the coil component according to the first preferred embodiment. FIG. 5 is a graph for describing a combination of the inductance of the coil L1 and the inductance of the coil L2. FIG. 6 is a cross-sectional view of the coil component 1 according to the first preferred embodiment. Referring to FIG. 3, FIGS. 4A to 4D, and FIG. 6, the shorter-side direction of the coil component 1 is the X direction, the longer-side direction thereof is the Y direction, and the height direction is the Z direction. The laminating direction on the substrate is the Z direction and the arrows indicate the upper-layer direction.

The coil component 1 includes a multilayer body 3 (a body) of ceramic layers. In the multilayer body 3, multiple substrates (ceramic green sheets) including coil wiring provided thereon in a manner illustrated in FIG. 3 and FIGS. 4A to 4D are laminated. The multilayer body 3 includes a pair of main surfaces that are opposed to each other and side surfaces with which the main surfaces are connected to each other. Multiple first wiring patterns 10 and multiple second wiring patterns 20 are sequentially laminated from the bottom so as to be parallel or substantially parallel to the main surfaces of the multilayer body 3 to define the coil L1 and the coil L2. Accordingly, the inductances of the coil L1 and the coil L2 are capable of being controlled based on the configuration of the first wiring patterns 10 and the second wiring patterns 20.

The side surfaces of the multilayer body 3 include a first side surface (the side surface having the electrode 4a (a first electrode) provided thereon) and a second side surface (the side surface having the electrode 4b (a second electrode) provided thereon), which are at the longer sides, and a third side surface (the side surface having the electrode 4c (a third electrode) provided thereon) and a fourth side surface (the side surface having an electrode 4d (a fourth electrode) provided thereon, which are at the shorter sides.

In the coil component 1, the first wiring patterns 10 and the second wiring patterns 20 of the coils L1 and L2, respectively, are arranged in the multilayer body 3. Each of the first wiring patterns 10 and the second wiring patterns 20 is formed by applying conductive paste (Ni paste) on ceramic green sheets 3a to 3d, which are substrates, using a screen printing method, as illustrated in FIGS. 4A to 4D.

A wiring pattern 20a, which is the second wiring pattern 20, is provided on the ceramic green sheet 3a. The wiring pattern 20a is extends around counterclockwise in the drawing from the center of the lower-side longer side in the drawing of the ceramic green sheet 3a along the respective sides and is provided to a lower portion along the left-side shorter side in the drawing. An end portion 21 for connection to the electrode 4b is provided at a starting end of the wiring pattern 20a and a connection portion 56a for connection to a via conductor 56 is provided at a trailing end thereof.

A wiring pattern 10b, which is the first wiring pattern 10, and a wiring pattern 20b, which is the second wiring pattern 20, are provided on the ceramic green sheet 3b. The wiring pattern 10b extends from a left-side portion along the upper-side longer side in the drawing of the ceramic green sheet 3b to the center of the right-side shorter side in the drawing. A connection portion 52b for connection to a via conductor 52 is provided at the starting end of the wiring pattern 10b and an end portion 31 for connection to the electrode 4c is provided at the trailing end thereof. The wiring pattern 20b extends from a left-side portion along the lower-side longer side in the drawing of the ceramic green sheet 3b to the center of the right-side shorter side in the drawing. A connection portion 56b for connection to the via conductor 56 is provided at the starting end of the wiring pattern 20b and the end portion 31 for connection to the electrode 4c is provided at the trailing end thereof.

A wiring pattern 10c, which is the first wiring pattern 10, is provided on the ceramic green sheet 3c. The wiring pattern 10c extends around clockwise in the drawing from the center of the upper-side longer side in the drawing of the ceramic green sheet 3c along the respective sides and is formed to an upper portion along the left-side shorter side in the drawing. An end portion 11 for connection to the electrode 4a is provided at the starting end of the wiring pattern 10c and a connection portion 52c for connection to the via conductor 52 is provided at the trailing end thereof.

A wiring pattern 10d, which is the first wiring pattern 10, is provided on the ceramic green sheet 3d. The wiring pattern 10d has the same shape as that of the wiring pattern 10c formed on the ceramic green sheet 3c. The end portion 11 for connection to the electrode 4a is provided at the starting end of the wiring pattern 10d and a connection portion 52d for connection to the via conductor 52 is provided at the trailing end thereof. The wiring pattern 10c and the wiring pattern 10d are portions in which the wiring patterns are connected in parallel in the coil L1.

The wiring pattern 20a on the ceramic green sheet 3a is electrically connected to the wiring pattern 20b on the ceramic green sheet 3b with the via conductor 56 to define the coil L2. The wiring pattern 10b on the ceramic green sheet 3b, the wiring pattern 10c on the ceramic green sheet 3c, and the wiring pattern 10d on the ceramic green sheet 3d are electrically connected to each other with the via conductor 52 to define the coil L1.

In the coil component 1 according to the first preferred embodiment, the number of the layers of the wiring patterns of the coil L1 is preferably greater than that of the wiring patterns of the coil L2, as illustrated in FIGS. 4A to 4D, to make the inductance and a resistance value of the coil L1 lower than those of the coil L2. The configuration illustrated in FIGS. 4A to 4D is especially effective because the wiring pattern 10c is connected in parallel to the wiring pattern 10d to decrease the resistance value of the coil L1 although the number of the layers of the wiring patterns of the coil L1 is increased.

The relationship between the mutual inductance M and the inductances of the coil L1 and the coil L2 will now be described. The mutual inductance M is represented by $M = -k(L1 \times L2)^{1/2}$ where the inductance of the coil L1 is denoted by L1, the inductance of the coil L2 is denoted by L2, and the coupling coefficient of the coil L1 and the coil L2 is denoted by k. Multiple combinations achieving M=−1.0 nH exist for the coil L1 and the coil L2, as illustrated in FIG. 5. The coupling coefficient k is set to about 0.5 (the coupling coefficient k=0.5) in FIG. 5.

The graph illustrated in FIG. 5 indicates that, when the inductance of the coil L1 is equal to the inductance of the coil L2 (for example, L1=L2=2.0 nH), the sum of the inductance of the coil L1 and the inductance of the coil L2 (L1+L2=4.0 nH) is minimized. At this time, the sizes of the coil L1 and the coil L2 are also minimized.

However, when the circuit component 200 is connected to the coil L1 side, as described above, it is necessary to decrease the inductance of the coil L1 while keeping the same mutual inductance M. For example, when the sum of the inductance of the coil L1 and the inductance of the coil L2 is doubled (L1+L2=8.0 nH), the inductance of the coil L1 is decreased to about 0.54 nH, for example.

When the inductance of the coil L1 is decreased from about 2.0 nH to about 0.54 nH, which is about a quarter of about 2.0 nH, and the circuit component 200 is connected to the coil L1 side, the resistance value from the capacitor C1 to the circuit component 200 is capable of being decreased by about one-fourth of the original value. In addition, the inductance from the capacitor C1 to the circuit component 200 is equal to the sum of the inductance of the coil L1 and the inductance of the capacitor C1, which is about 1.54 nH. This is about half of the inductance from the capacitor C1 to the circuit component 200 when the inductance of the coil L1 is about 2.0 nH. Since the equivalent series inductance ESL of about 1.0 nH exists when only the capacitor C1 is connected to the circuit component 200, it is possible to greatly reduce the influence of the coil L1 on electric charge supply from the capacitor C1 to the circuit component 200 even if the inductance from the capacitor C1 to the circuit component 200 is increased to about 1.54 nH, which is the sum of the inductance of the coil L1 and the inductance of the capacitor C1.

When the inductance of the coil L1 is decreased from about 2.0 nH to about 0.54 nH, which is about a quarter of about 2.0 nH, the inductance of the coil L2 is increased from about 2.0 nH to about 8.46 nH, which is about a quadruple of about 2.0 nH. The capacitor C1 in the filter circuit 100 performs electric charge supply to the circuit component 200. In contrast, since the coil L2 mainly performs noise reduction for the capacitor C1, the increase in the inductance of the coil L2 is advantageous.

Referring back to FIGS. 4A to 4D, in the coil component 1, at least one ceramic green sheet 3a, at least one ceramic green sheet 3b, at least one ceramic green sheet 3c, and at least one ceramic green sheet 3d are laminated and multiple ceramic green sheets (dummy layers) having no printed wiring pattern are laminated on both of the upper and bottom sides. The multiple ceramic green sheets including the dummy layers are subjected to pressure bonding to form the multilayer body 3 (a ceramic body) that is not fired. The formed multilayer body 3 is fired and a copper electrode is baked on the outside of the fired multilayer body 3 so as to conduct to the wiring patterns to form the electrodes 4a to 4d.

As for the number of the laminated layer, for example, one ceramic green sheet 3a, three ceramic green sheets 3b, and five ceramic green sheets 3c and 3d may be laminated in the coil component 1. Accordingly, the coil component 1 includes one layer of the wiring pattern 20a, three layers of the wiring patterns 10b and 20b, and five layers of the wiring patterns 10c and 10d, as illustrated in FIG. 6.

The multiple ceramic green sheets on which the wirings of the first wiring patterns 10 of the coil L1 and the second wiring patterns 20 of the coil L2 are formed are laminated in the coil component 1. Accordingly, in the coil component 1, the coil L1 and the coil L2 are arranged so that an opening of the coil L1 is at least partially overlapped with an opening of the coil L2 when the first wiring patterns 10 and the second wiring patterns 20 are viewed from the main surface direction. The magnetic coupling between the coil L1 and the coil L2 is varied depending on the degree of overlapping of the opening of the coil L1 and the opening of the coil L2.

As described above, the coil component 1 is formed by laminating the multiple wiring patterns, which are metal portions, and the multiple ceramic green sheets, which are ceramic portions, and applying pressure to the wiring patterns and the ceramic green sheets that are laminated. However, since the metal portions have malleability different from that of the ceramic portions, the multilayer body 3 may crack due to the difference in compressibility between the metal portions and the ceramic portions during the application of the pressure. Since the coil component 1 is fired after the application of the pressure, as described above, the multilayer body 3 may crack due to the difference in the thermal shrinkage ratio between the metal portions and the ceramic portions during the firing.

In the coil component 1 according to the first preferred embodiment, in order to prevent the multilayer body 3 from cracking during manufacturing, the number of the wiring patterns for which the end portion 11 for connection to the electrode 4a is provided, among the first wiring patterns 10, is decreased. Similarly, in the coil component 1, the number of the wiring patterns for which the end portion 21 for connection to the electrode 4b is provided, among the second wiring patterns 20, may be decreased or the number of the wiring patterns for which the end portion 31 for connection to the electrode 4c is provided, among the first wiring patterns 10 or the second wiring patterns 20, may be decreased.

Specifically, when the multiple first wiring patterns 10 include the five layers of the wiring patterns 10c and 10d, as illustrated in FIG. 6, the end portion 11 for electrical connection to the electrode 4a is provided for the first wiring patterns 10 of the odd-number layers and the end portion 11 for electrical connection to the electrode 4a is not provided for the first wiring patterns 10 of the even-number layers.

In addition, in the coil component 1 according to the first preferred embodiment, one main surface of the multilayer body 3, which is close to the coil L1, is used as a mounting surface (the bottom-side surface in FIG. 6). In other words, in the coil component 1, mounting the multilayer body 3 on the substrate so that the side on which the coil L1 is provided is at the bottom side makes the distance from the end portion 11 to the electrode on the substrate via the electrode 4a shorter than the distance from the end portion 21 to the electrode on the substrate via the electrode 4b. Although the circuit configuration is not varied regardless of whether the inductance of the coil L1 or the inductance of the coil L2 is decreased, making the inductance of the coil L1 lower than that of the coil L2 is advantageous because the resistance value from the coil L1 to the circuit component 200 is capable of being decreased when the coil L1 and the coil L2 are laminated on the mounting surface in this order.

As described above, the coil component 1 according to the first preferred embodiment includes the multilayer body 3 including multiple laminated insulating layers and that includes the pair of the main surfaces that are opposed to each other and the four side surfaces with which the main surfaces are connected to each other, the coil L1 including a portion of the multiple wiring patterns laminated in the multilayer body 3, the coil L2 that is provided on layers different from those of the coil L1 and including a portion of the multiple wiring patterns, the electrode 4a that is provided on the first side surface and that is electrically connected to one end of the coil L1, the electrode 4b that is provided on the second side surface opposed to the first side surface and that is electrically connected to one end of the coil L2, and the electrode 4c that is provided on the third side surface that is not opposed to the first side surface and that is electrically connected to the other end of the coil L1 and the other end of the coil L2. The opening of the coil L1 is at least partially overlapped with the opening of the coil L2 when viewed from the main surface direction. The electrode 4c is grounded via the capacitor C1. The coil L1 has an inductance lower than that of the coil L2.

With the above configuration, since the inductance of the coil L1 is lower than that of the coil L2 in the coil component 1 according to the first preferred embodiment, it is possible to improve the rising of the electric charge supplied from the capacitor C1 connected to the electrode 4c.

One main surface of the multilayer body 3, which is close to the coil L1, is preferably used as the mounting surface. With this configuration, since the distance from the coil L1 to the electrode on the substrate via the electrode 4a is made shorter than the distance from the coil L2 to the electrode on the substrate via the electrode 4b, it is possible to decrease the resistance value from the coil L1 to the circuit component 200.

At least one of the coil L1 and the coil L2 preferably includes a portion in which the wiring patterns on the respective multiple layers are connected in parallel to each other. With this configuration, it is possible to decrease the resistance value of the coil having the portion in which the multiple wiring patterns are connected in parallel to each other.

The number of the layers of the wiring patterns that are connected in parallel of the coil L1 is preferably greater than that of the coil L2. With this configuration, it is possible to make the resistance value of the coil L1 lower than that of the coil L2.

The filter circuit 100 according to the first preferred embodiment includes the coil component 1 described above and the capacitor C1 connected to the electrode 4c between the coil L1 and the coil L2 in the coil component 1. With this configuration, in the filter circuit 100, it is possible to improve the rising of the electric charge supplied from the capacitor C1 to the circuit component 200 connected via the coil L1.

The electronic device according to the first preferred embodiment includes the circuit component 200 mounted on the substrate and the filter circuit 100 connected to the circuit component 200 with its one end. The filter circuit 100 includes the coil component 1 and the capacitor C1. The coil component 1 includes the multilayer body 3 including multiple laminated insulating layers and that includes the pair of the main surfaces that are opposed to each other and the four side surfaces with which the main surfaces are connected to each other, the coil L1 including a portion of the multiple wiring patterns laminated in the multilayer body 3, the coil L2 that is provided on layers different from those of the coil L1 and including a portion of the multiple wiring patterns, the electrode 4a that is provided on the first side surface and that is electrically connected to one end of the coil L1, the electrode 4b that is provided on the second side surface opposed to the first side surface and that is electrically connected to one end of the coil L2, and the electrode 4c that is provided on the third side surface that is not opposed to the first side surface and that is electrically connected to the other end of the coil L1 and the other end of the coil L2. The opening of the coil L1 is at least partially overlapped with the opening of the coil L2 when viewed from the main surface direction. The electrode 4a is connected to the circuit component 200. The electrode 4c is grounded via the capacitor C1. The coil L1 has an inductance lower than that of the coil L2.

With the above configuration, since the coil L1 in the coil component 1 has an inductance lower than that of the coil L2 in the coil component 1 in the electronic device according to the first preferred embodiment, it is possible to improve the rising of the electric charge supplied from the capacitor C1 to the circuit component 200 connected via the coil L1.

Second Preferred Embodiment

The configuration is described in the first preferred embodiment in which the coil L1 in the coil component 1 includes the multiple layers to make the inductance and the resistance value of the coil L1 lower than those of the coil L2. A configuration is described in a second preferred embodiment in which the position where the electrode is extended between the coil L1 and the coil L2 is changed and the number of turns of the wiring patterns of the coil L1 is made smaller than that of the coil L2 to decrease the inductance and the resistance value.

Figure 7A:
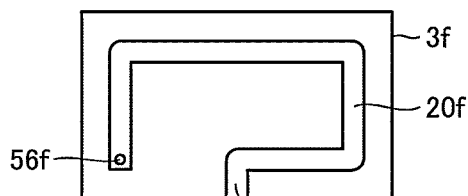
FIGS. 7A to 7C are exploded plan views illustrating the configuration of a coil component according to a second preferred embodiment of the present invention.
Figure 7B:
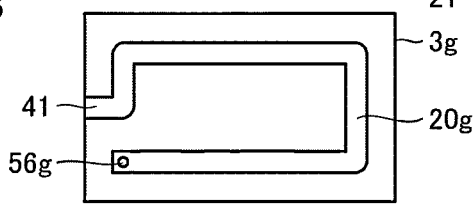
Figure 7C:
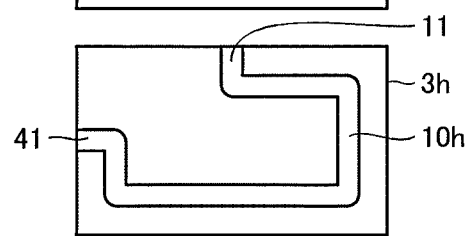

FIGS. 7A to 7C are exploded plan views illustrating the configuration of a coil component according to the second preferred embodiment. The same reference numerals and letters are used in the coil component described in the second preferred embodiment to identify the same components according to the first preferred embodiment and a detailed description of such components is not repeated in the second preferred embodiment. In addition, instead of the coil component 1 according to the first preferred embodiment, the coil component described in the second preferred embodiment is applicable to the filter circuit 100 and the electronic device according to the first preferred embodiment.

Each of the first wiring patterns 10 and the second wiring patterns 20 is formed by applying the conductive paste (Ni paste) on ceramic green sheets 3f to 3h, which are substrates, using the screen printing method, as illustrated in FIGS. 7A to 7C.

A wiring pattern 20f, which is the second wiring pattern 20, is provided on the ceramic green sheet 3f. The wiring pattern 20f extends around counterclockwise in the drawing from the center of the lower-side longer side in the drawing of the ceramic green sheet 3f along the respective sides and is provided to a lower portion along the left-side shorter side in the drawing. The end portion 21 for connection to the electrode 4b is provided at the starting end of the wiring pattern 20f and a connection portion 56f for connection to the via conductor 56 is provided at the trailing end thereof.

A wiring pattern 20g, which is the second wiring pattern 20, is provided on the ceramic green sheet 3g. The wiring pattern 20g extends around counterclockwise in the drawing from a left-side portion along the lower-side longer side in the drawing of the ceramic green sheet 3g along the respective sides and is provided to the center of the left-side shorter side in the drawing. A connection portion 56g for connection to the via conductor 56 is provided at the starting end of the wiring pattern 20g and an end portion 41 for connection to the electrode 4d is provided at the trailing end thereof.

A wiring pattern 10h, which is the first wiring pattern 10, is provided on the ceramic green sheet 3h. The wiring pattern 10h extends around clockwise in the drawing from the center of the upper-side longer side in the drawing of the ceramic green sheet 3h along the respective sides and is provided to the center of the left-side shorter side in the drawing. The end portion 11 for connection to the electrode 4a is provided at the starting end of the wiring pattern 10h and the end portion 41 for connection to the electrode 4d is provided at the trailing end thereof.

The wiring pattern 20f on the ceramic green sheet 3f is electrically connected to the wiring pattern 20g on the ceramic green sheet 3g with the via conductor 56 to define the coil L2. The wiring pattern 10h on the ceramic green sheet 3h composes the coil L1. In addition, the position where the electrode connected between the coil L1 and the coil L2 is extended is changed from the electrode 4c to the electrode 4d to make the number of turns of the wiring patterns of the coil L1 smaller than that of the coil L2.

In the coil component 1 according to the second preferred embodiment, since the number of turns of the wiring patterns of the coil L1 is smaller than that of the coil L2, as illustrated in FIGS. 7A to 7C, it is possible to decrease the inductance and the resistance value of the coil L1. Although the position where the electrode connected between the coil L1 and the coil L2 is extended is changed from the electrode 4c to the electrode 4d to decrease the inductance and the resistance value of the coil L1, it is necessary to connect the capacitor C1 to the electrode 4d and, thus, it is necessary to adjust the wiring from the capacitor C1 to the electrode 4d in the filter circuit 100.

As described above, in the coil component 1 according to the second preferred embodiment, the number of turns of the wiring patterns of the coil L1 is smaller than that of the coil L2. Accordingly, since the inductance of the coil L1 is lower than that of the coil L2 in the coil component 1 according to the second preferred embodiment, it is possible to improve the rising of the electric charge supplied from the capacitor C1 connected to the electrode 4d.

Third Preferred Embodiment

The configuration is described in the second preferred embodiment in which the position where the electrode between the coil L1 and the coil L2 is extended is changed to make the number of turns of the wiring patterns of the coil L1 smaller than that of the coil L2. A configuration is described in a third preferred embodiment in which the wiring widths of the wiring patterns are changed to make the inductance and the resistance value of the coil L1 lower than those of the coil L2.

Figure 8A:
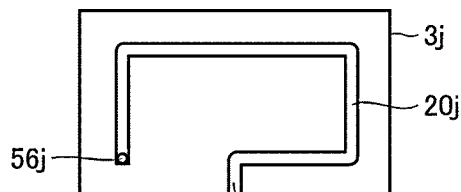
FIGS. 8A to 8C are exploded plan views illustrating the configuration of a coil component according to a third preferred embodiment of the present invention.
Figure 8B:
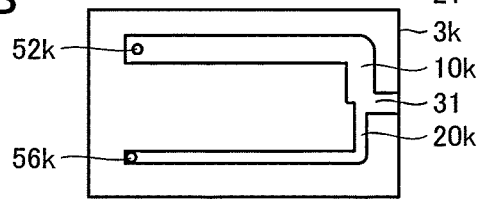
Figure 8C:
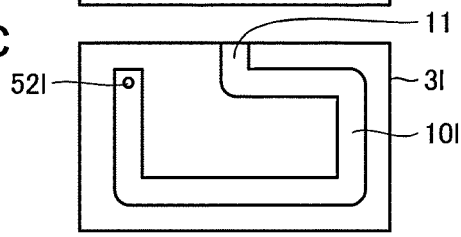

FIGS. 8A to 8C are exploded plan views illustrating the configuration of a coil component according to the third preferred embodiment. The same reference numerals and letters are used in the coil component described in the third preferred embodiment to identify the same components according to the first preferred embodiment and a detailed description of such components is not repeated in the third preferred embodiment. In addition, instead of the coil component 1 according to the first preferred embodiment, the coil component described in the third preferred embodiment is applicable to the filter circuit 100 and the electronic device according to the first preferred embodiment.

Each of the first wiring patterns 10 and the second wiring patterns 20 is formed by applying the conductive paste (Ni paste) on ceramic green sheets 3j to 3l, which are substrates, using the screen printing method, as illustrated in FIGS. 8A to 8C.

A wiring pattern 20j, which is the second wiring pattern 20, is provided on the ceramic green sheet 3j. The wiring pattern 20j extends around counterclockwise in the drawing from the center of the lower-side longer side in the drawing of the ceramic green sheet 3j along the respective sides and is provided to a lower portion along the left-side shorter side in the drawing. The end portion 21 for connection to the electrode 4b is provided at the starting end of the wiring pattern 20j and a connection portion 56j for connection to the via conductor 56 is provided at the trailing end thereof.

A wiring pattern 10k, which is the first wiring pattern 10, and a wiring pattern 20k, which is the second wiring pattern 20, are provided on the ceramic green sheet 3k. The wiring pattern 10k extends from a left-side portion along the upper-side longer side in the drawing of the ceramic green sheet 3k to the center of the right-side shorter side in the drawing. A connection portion 52k for connection to the via conductor 52 is provided at the starting end of the wiring pattern 10k and the end portion 31 for connection to the electrode 4c is provided at the trailing end thereof. The wiring pattern 20k extends from a left-side portion along the lower-side longer side in the drawing of the ceramic green sheet 3k to the center of the right-side shorter side in the drawing. A connection portion 56k for connection to the via conductor 56 is provided at the starting end of the wiring pattern 20k and the end portion 31 for connection to the electrode 4c is provided at the trailing end thereof. The wiring width of the wiring pattern 10k is wider than that of the wiring pattern 20k.

A wiring pattern 10l, which is the first wiring pattern 10, is provided on the ceramic green sheet 3l. The wiring pattern 10l extends around clockwise in the drawing from the center of the upper-side longer side in the drawing of the ceramic green sheet 3l along the respective sides and is provided to an upper portion along the left-side shorter side in the drawing. The end portion 11 for connection to the electrode 4a is provided at the starting end of the wiring pattern 10l and a connection portion 52l for connection to the via conductor 52 is provided at the trailing end thereof. The wiring width of the wiring pattern 10l is wider than that of the wiring pattern 20j.

The wiring pattern 20j on the ceramic green sheet 3j is electrically connected to the wiring pattern 20k on the ceramic green sheet 3k with the via conductor 56 to define the coil L2. The wiring pattern 10k on the ceramic green sheet 3k is electrically connected to the wiring pattern 10l on the ceramic green sheet 3l with the via conductor 52 to define the coil L1. The wiring widths of the wiring patterns of the coil L1 is wider than those of the coil L2.

In the coil component 1 according to the third preferred embodiment, making the wiring widths of the wiring patterns of the coil L1 wider than those of the wiring patterns of the coil L2, as illustrated in FIGS. 8A to 8C, enables the inductance and the resistance value of the coil L1 to be decreased. The wiring widths of the wiring patterns of the coil L2 may be decreased or the wiring widths of the wiring patterns of the coil L1 may be increased as long as the wiring widths of the wiring patterns of the coil L1 is relatively wider than those of the coil L2.

As described above, in the coil component 1 according to the third preferred embodiment, the wiring widths of the wiring patterns of the coil L1 is wider than those of the coil L2. Accordingly, since the inductance of the coil L1 is lower than that of the coil L2 in the coil component 1 according to the third preferred embodiment, it is possible to improve the rising of the electric charge supplied from the capacitor C1 connected to the electrode 4c.

Fourth Preferred Embodiment

The configuration is described in the second preferred embodiment in which the position where the electrode between the coil L1 and the coil L2 is extended is changed to make the number of turns of the wiring patterns of the coil L1 smaller than that of the coil L2. A configuration is described in a fourth preferred embodiment in which the position of the wiring pattern connected to the capacitor C1 is changed to decrease the inductance and the resistance value of the coil L1.

In a coil component according to the fourth preferred embodiment, the end portion 31 for connection to the electrode 4c is provided in the configuration of the coil component according to the second preferred embodiment. A case in which the capacitor C1 is connected to the electrode 4c is referred to as a first connection configuration and a case in which the capacitor C1 is connected to the electrode 4d is referred to as a second connection configuration. The same reference numerals and letters are used in the coil component described in the fourth preferred embodiment to identify the same components according to the first preferred embodiment and a detailed description of such components is not repeated in the fourth preferred embodiment. In addition, instead of the coil component 1 according to the first preferred embodiment, the coil component described in the fourth preferred embodiment is applicable to the filter circuit 100 and the electronic device according to the first preferred embodiment.

Figure 9A:
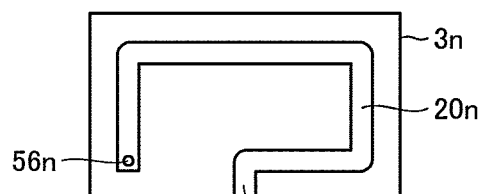
FIGS. 9A to 9C is are exploded plan views illustrating the configuration of first connection of a coil component according to a fourth preferred embodiment of the present invention.
Figure 9B:
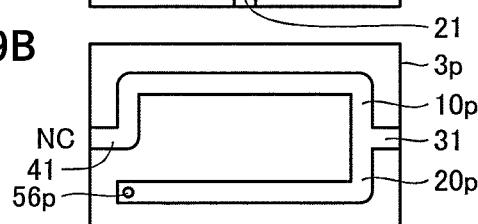
Figure 9C:
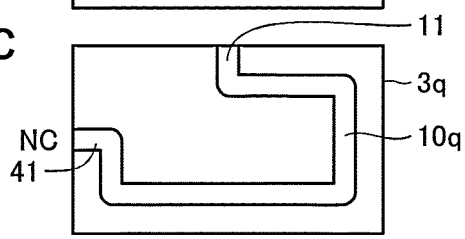

FIGS. 9A to 9C are exploded plan views illustrating the first connection configuration of the coil component according to the fourth preferred embodiment. Each of the first wiring patterns 10 and the second wiring patterns 20 is formed by applying the conductive paste (Ni paste) on ceramic green sheets 3n to 3q, which are substrates, using the screen printing method, as illustrated in FIGS. 9A to 9C.

A wiring pattern 20n, which is the second wiring pattern 20, is provided on the ceramic green sheet 3n. The wiring pattern 20n extends around counterclockwise in the drawing from the center of the lower-side longer side in the drawing of the ceramic green sheet 3n along the respective sides and is provided to a lower portion along the left-side shorter side in the drawing. The end portion 21 for connection to the electrode 4b is provided at the starting end of the wiring pattern 20n and a connection portion 56n for connection to the via conductor 56 is provided at the trailing end thereof.

In the first connection in which the capacitor C1 is connected to the electrode 4c, a wiring pattern 10p, which is the first wiring pattern 10, and a wiring pattern 20p, which is the second wiring pattern 20, are provided on the ceramic green sheet 3p. The wiring pattern 10p is counterclockwise in the drawing from the center of the right-side shorter side in the drawing of the ceramic green sheet 3p along the upper-side longer side in the drawing and is provided to the center of the left-side shorter side in the drawing. The end portion 31 for connection to the electrode 4c is provided at the starting end of the wiring pattern 10p and the end portion 41 for connection to the electrode 4d is provided at the trailing end thereof.

The wiring pattern 20p is counterclockwise in the drawing from a left-side portion along the lower-side longer side in the drawing of the ceramic green sheet 3p along the lower-side longer side in the drawing and is provided to the center of the right-side shorter side in the drawing. A connection portion 56p for connection to the via conductor 56 is provided at the starting end of the wiring pattern 20p and the end portion 31 for connection to the electrode 4c is provided at the trailing end thereof.

A wiring pattern 10q, which is the first wiring pattern 10, is provided on the ceramic green sheet 3q. The wiring pattern 10q extends around clockwise in the drawing from the center of the upper-side longer side in the drawing of the ceramic green sheet 3q along the respective sides and is provided to the center of the left-side shorter side in the drawing. The end portion 11 for connection to the electrode 4a is provided at the starting end of the wiring pattern 10q and the end portion 41 for connection to the electrode 4d is provided at the trailing end thereof.

The wiring pattern 20n on the ceramic green sheet 3n is electrically connected to the wiring pattern 20p on the ceramic green sheet 3p with the via conductor 56 to define the coil L2. The wiring pattern 10p on the ceramic green sheet 3p is electrically connected to the wiring pattern 10q on the ceramic green sheet 3q with the electrode 4d to define the coil L1.

Figure 10:
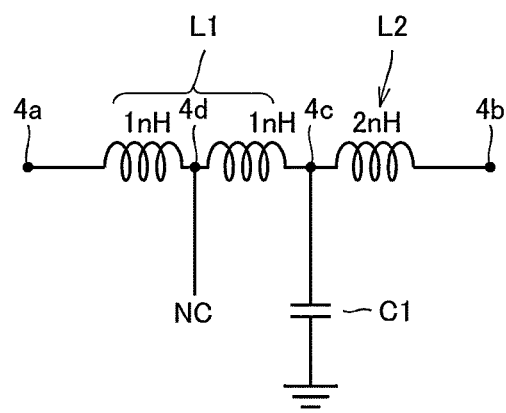
FIG. 10 is a circuit diagram of a filter circuit including the coil component of the first connection according to the fourth preferred embodiment of the present invention.

In the first connection, since the electrode connected between the coil L1 and the coil L2 is not the electrode 4d but the electrode 4c, the number of turns of the wiring patterns of the coil L1 is equal to that of the coil L2. FIG. 10 is a circuit diagram of the filter circuit including the coil component of the first connection according to the fourth preferred embodiment. As illustrated in FIG. 10, the capacitor C1 is connected to the electrode 4c and the electrode 4d is non-connection (NC). In this case, the inductance of the coil L1 is 1+1=2 nH and the inductance of the coil L2 is about 2 nH. Accordingly, the inductance of the coil L1 is equal or substantially equal to that of the coil L2. In addition, since the length of the wiring patterns of the coil L1 is equal or substantially equal to that of the coil L2, the resistance value of the coil L1 is equal or substantially equal to that of the coil L2.

Figure 11A:
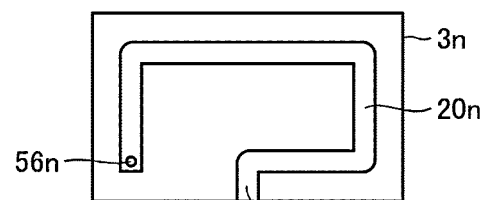
FIGS. 11A to 11C are exploded plan views illustrating the configuration of second connection of the coil component according to the fourth preferred embodiment of the present invention.
Figure 11B:
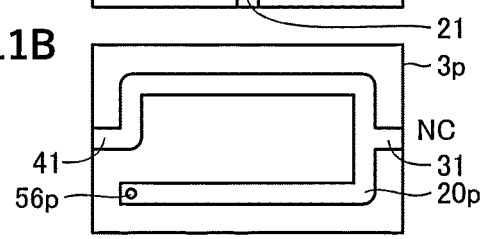
Figure 11C:
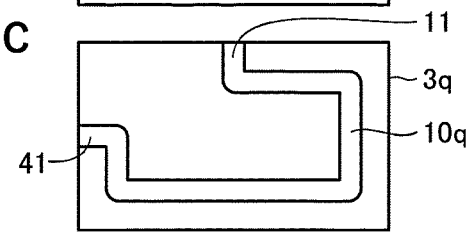

FIGS. 11A to 11C are exploded plan views illustrating the second connection configuration of the coil component according to the fourth preferred embodiment. Each of the first wiring patterns 10 and the second wiring patterns 20 is formed by applying the conductive paste (Ni paste) on the ceramic green sheets 3n to 3q, which are substrates, using the screen printing method, as illustrated in FIGS. 11A to 11C.

The wiring pattern 20n, which is the second wiring pattern 20, is provided on the ceramic green sheet 3n. The wiring pattern 20n extends around counterclockwise in the drawing from the center of the lower-side longer side in the drawing of the ceramic green sheet 3n along the respective sides and is provided to a lower portion along the left-side shorter side in the drawing. The end portion 21 for connection to the electrode 4b is provided at the starting end of the wiring pattern 20n and the connection portion 56n for connection to the via conductor 56 is provided at the trailing end thereof.

In the second connection in which the capacitor C1 is connected to the electrode 4d, the wiring pattern 20p, which is the second wiring pattern 20, is provided on the ceramic green sheet 3p. The wiring pattern 20p is counterclockwise in the drawing from a left-side portion along the lower-side longer side in the drawing of the ceramic green sheet 3p along the respective sides and is provided to the center of the left-side shorter side in the drawing. The connection portion 56p for connection to the via conductor 56 is provided at the starting end of the wiring pattern 20p and the end portion 41 for connection to the electrode 4d is provided at the trailing end thereof. The end portion 31 for connection to the electrode 4c is provided along the wiring pattern 20p.

The wiring pattern 10q, which is the first wiring pattern 10, is provided on the ceramic green sheet 3q. The wiring pattern 10q extends around clockwise in the drawing from the center of the upper-side longer side in the drawing of the ceramic green sheet 3q along the respective sides and is provided to the center of the left-side shorter side in the drawing. The end portion 11 for connection to the electrode 4a is provided at the starting end of the wiring pattern 10q and the end portion 41 for connection to the electrode 4d is provided at the trailing end thereof.

The wiring pattern 20n on the ceramic green sheet 3n is electrically connected to the wiring pattern 20p on the ceramic green sheet 3p with the via conductor 56 to define the coil L2. The wiring pattern 10q on the ceramic green sheet 3q composes the coil L1.

Figure 12:
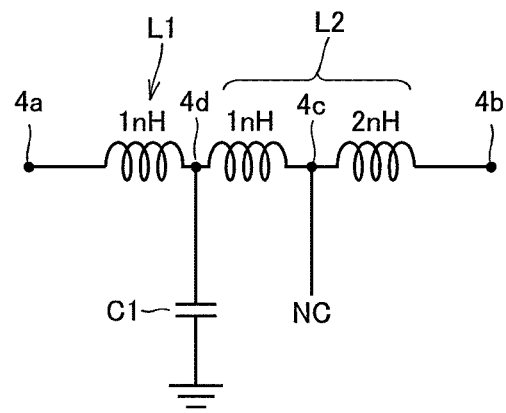
FIG. 12 is a circuit diagram of a filter circuit including the coil component of the second connection according to the fourth preferred embodiment of the present invention.

In the second connection, since the electrode connected between the coil L1 and the coil L2 is not the electrode 4c but the electrode 4d, the number of turns of the wiring patterns of the coil L1 is smaller than that of the coil L2. FIG. 12 is a circuit diagram of the filter circuit including the coil component of the second connection according to the fourth preferred embodiment. As illustrated in FIG. 12, the capacitor C1 is connected to the electrode 4d and the electrode 4c is non-connection (NC). In this case, the inductance of the coil L1 is 1 nH and the inductance of the coil L2 is 2+1=3 nH. Accordingly, the inductance of the coil L1 is lower than that of the coil L2. In addition, since the length of the wiring patterns of the coil L1 is shorter than that of the coil L2, the resistance value of the coil L1 is also lower than that of the coil L2.

As described above, the coil component 1 according to the fourth preferred embodiment further includes the electrode 4d that is provided on the fourth side surface opposed to the third side surface and that is electrically connected to the coil L1 and the coil L2. One of the electrode 4c and the electrode 4d is grounded via the capacitor C1.

With the above configuration, in the coil component 1 according to the fourth preferred embodiment, the inductance of the coil L1 with respect to the coil L2 is capable of being varied depending on whether the capacitor C1 is connected to the electrode 4c or the capacitor C1 is connected to the electrode 4d. In particular, in the connection (the second connection) in which the inductance of the coil L1 is lower than that of the coil L2, it is possible to improve the rising of the electric charge supplied from the capacitor C1 connected to the electrode 4d.

The filter circuit 100 according to the fourth preferred embodiment includes the coil component 1 described above and the capacitor C1 connected to the electrode 4d between the coil L1 and the coil L2 in the coil component 1. With this configuration, in the filter circuit 100, it is possible to improve the rising of the electric charge supplied from the capacitor C1 to the circuit component 200 connected via the coil L1.

Modifications

Figure 13:
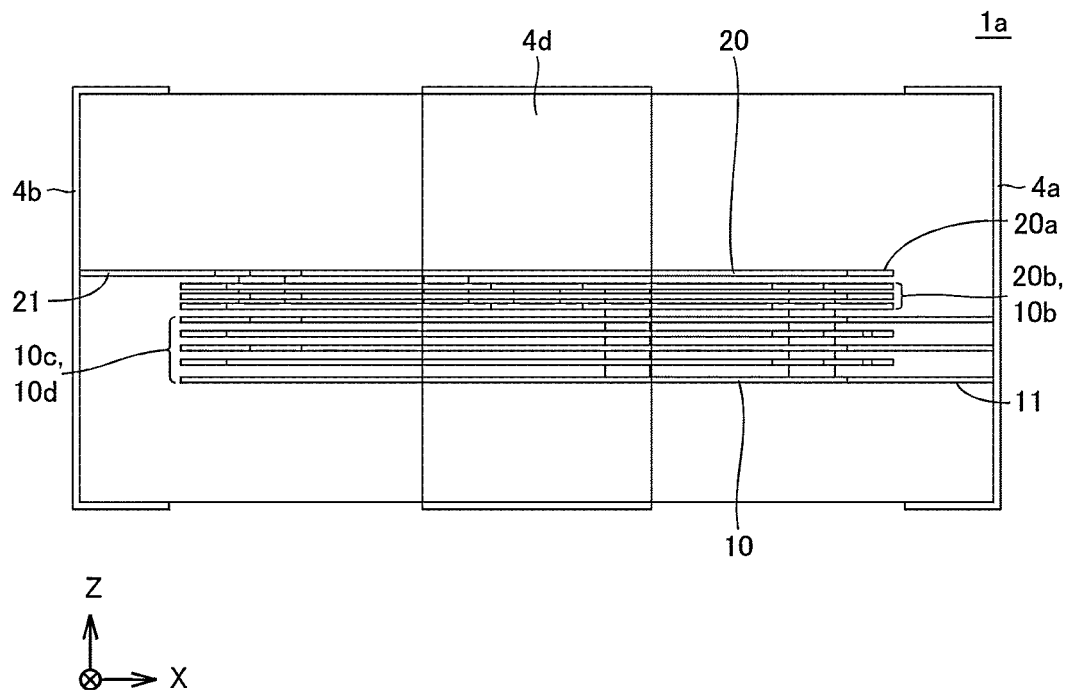
FIG. 13 is a cross-sectional view of a coil component according to a modification of a preferred embodiment of the present invention.

The spacing in the laminating direction of the wiring patterns of the coil L1 is equal or substantially equal to the spacing in the laminating direction of the wiring patterns of the coil L2 in the coil components described above. However, the spacing in the laminating direction of the wiring patterns of the coil L1 is not limitedly equal to that of the coil L2. FIG. 13 is a cross-sectional view of a coil component according to a modification of a preferred embodiment of the present invention. As illustrated in FIG. 13, the spacing in the laminating direction of the first wiring patterns 10 of the coil L1 is wider than the spacing in the laminating direction of the second wiring patterns 20 of the coil L2.

Making the spacing in the laminating direction of the wiring patterns of the coil L1 wider than that of the coil L2 enables the inductance and the resistance value of the coil L1 to be lower than those of the coil L2. Accordingly, when the circuit component 200 is connected to the coil L1 illustrated in FIG. 13, it is possible to improve the rising of the electric charge supplied from the capacitor C1.

The inductance and the resistance value of the coil L1 are lower than those of the coil L2 in the coil components described above. However, the inductance and the resistance value of the coil L2, which is laminated above the coil L1, may be lower than those of the coil L1. In other words, the coil L2 may be the first coil connected to the circuit component.

Figure 14:
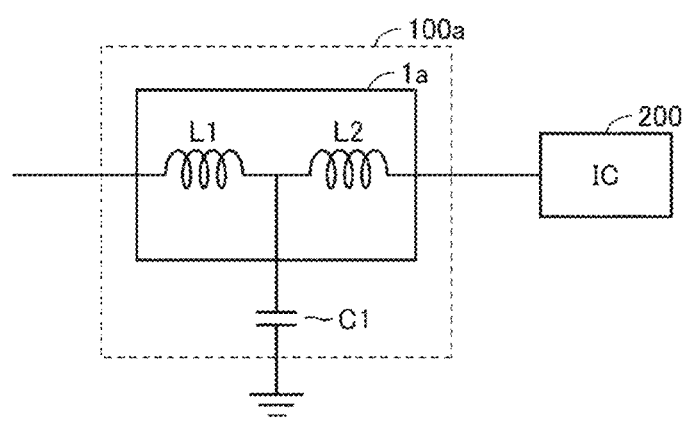
FIG. 14 is a diagram schematically illustrating the configuration of an electronic device according to a modification of a preferred embodiment of the present invention.

FIG. 14 is a diagram schematically illustrating the configuration of an electronic device according to a modification of a preferred embodiment of the present invention. The electronic device illustrated in FIG. 14 includes the circuit component 200 mounted on a substrate (not illustrated) and a filter circuit 100a connected to the circuit component 200 with its one end.

The circuit component 200 is, for example, an integrated circuit (IC) and uses electric charge accumulated in a capacitor included in the filter circuit 100a when the power consumption is temporarily increased. The filter circuit 100a includes a coil component 1a and the capacitor C1. The circuit component 200 is connected to the electrode 4b of the coil L2.

Although the coil component 1a has the configuration in which the coil L2 is laminated above the coil L1, as illustrated in FIG. 3, the inductance and the resistance value of the coil L2 is made lower than those of the coil L1. Accordingly, when the circuit component 200 is connected to the coil L2 in the coil component 1a, as illustrated in FIG. 14, it is possible to improve the rising of the electric charge supplied from the capacitor C1. The coil L2 is used as the first coil in the modification illustrated in FIG. 14.

Although the coil component 1 is described above as the multilayer body 3 (the ceramic body) having the multiple ceramic layers laminated therein, it is sufficient for the coil component 1 to have a dielectric multilayer structure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
   an integrated circuit mounted on a substrate; and
   a filter circuit connected to the integrated circuit; wherein
   the filter circuit includes a coil component and a capacitor;
   the coil component includes:
      a body including a pair of main surfaces that are opposed to each other, and four side surfaces with which the main surfaces are connected to each other;
      a first coil including a first plurality of wiring patterns in the body;
      a second coil including a second plurality of wiring patterns in the body;
      a first electrode on a first side surface and electrically connected to one end of the first coil;
      a second electrode on a second side surface opposed to the first side surface and electrically connected to one end of the second coil; and
      a third electrode on a third side surface not opposed to the first side surface and electrically connected to the other end of the first coil and the other end of the second coil;
   an opening of the first coil is at least partially overlapped with an opening of the second coil when viewed from a main surface direction;
   the first electrode is connected to the integrated circuit;
   the third electrode is grounded via the capacitor; and
   the first coil has an inductance lower than that of the second coil.

2. The electronic device according to claim 1, wherein one main surface of the body, which is closest to the first coil, is a mounting surface.

3. The electronic device according to claim 1, wherein
   the body includes a plurality of laminated insulating layers;
   the first coil is on a portion of the plurality of insulating layers; and the second coil is on another portion of the plurality of insulating layers.

4. The electronic device according to claim 3, wherein at least one of the first coil and the second coil includes a portion in which the wiring patterns on the respective plurality of layers are connected in parallel to each other.

5. The electronic device according to claim 4, wherein a number of layers of the wiring patterns that are connected in parallel of the first coil is greater than that of the second coil.

6. The electronic device according to claim 1, wherein a number of turns of the wiring patterns of the first coil is smaller than that of the second coil.

7. The electronic device according to claim 1, wherein wiring widths of the wiring patterns of the first coil are wider than those of the wiring patterns of the second coil.

8. The electronic device according to claim 1, wherein a spacing in a laminating direction of the wiring patterns of the first coil is wider than a spacing in the laminating direction of the wiring patterns of the second coil.

9. The electronic device according to claim 1, wherein the coil component further includes a fourth electrode on a fourth side surface opposed to the third side surface and electrically connected to the first coil and the second coil.

10. A coil component comprising:
a body including a pair of main surfaces that are opposed to each other and four side surfaces with which the main surfaces are connected to each other;
a first coil including a first plurality of wiring patterns in the body;
a second coil including a second plurality of wiring patterns in the body;
a first electrode on a first side surface and electrically connected to one end of the first coil;
a second electrode on a second side surface opposed to the first side surface and electrically connected to one end of the second coil; and
a third electrode on a third side surface not opposed to the first side surface and electrically connected to the other end of the first coil and the other end of the second coil;
wherein
an opening of the first coil is at least partially overlapped with an opening of the second coil when viewed from a main surface direction; and
the first coil has an inductance lower than that of the second coil.

11. The coil component according to claim 10, wherein one main surface of the body, which is closest to the first coil, is a mounting surface.

12. The coil component according to claim 10, wherein the body includes a plurality of laminated insulating layers;
the first coil is on a portion of the plurality of insulating layers; and
the second coil is on another portion of the plurality of insulating layers.

13. The coil component according to claim 12, wherein at least one of the first coil and the second coil includes a portion in which the wiring patterns on the respective plurality of layers are connected in parallel to each other.

14. The coil component according to claim 13, wherein a number of layers of the wiring patterns that are connected in parallel of the first coil is greater than that of the second coil.

15. The coil component according to claim 10, wherein a number of turns of the wiring patterns of the first coil is smaller than that of the second coil.

16. The coil component according to claim 10, wherein wiring widths of the wiring patterns of the first coil are wider than those of the wiring patterns of the second coil.

17. The coil component according to claim 10, wherein a spacing in a laminating direction of the wiring patterns of the first coil is wider than a spacing in the laminating direction of the wiring patterns of the second coil.

18. The coil component according to claim 10, wherein the coil component further includes a fourth electrode on a fourth side surface opposed to the third side surface and electrically connected to the first coil and the second coil.

19. A filter circuit comprising:
the coil component according to claim 10; and
a capacitor connected to the third electrode between the first coil and the second coil in the coil component; wherein
the third electrode is grounded via the capacitor.

20. A filter circuit comprising:
the coil component according to claim 10;
the coil component further including a fourth electrode on a fourth side surface opposed to the third side surface and electrically connected to the first coil and the second coil; and
a capacitor connected to the fourth electrode between the first coil and the second coil in the coil component.

* * * * *